United States Patent
Lipson et al.

(10) Patent No.: US 11,520,241 B2
(45) Date of Patent: Dec. 6, 2022

(54) LITHOGRAPHY SUPPORTS WITH DEFINED BURLTOP TOPOGRAPHY

(71) Applicant: ASML HOLDING N.V., Veldhoven (NL)

(72) Inventors: Matthew Lipson, Stamford, CT (US); David Allen Heald, Brookfield, CT (US); Iliya Sigal, Stamford, CT (US)

(73) Assignee: ASML Holding N.V., Veldhoven (NL)

( * ) Notice: Subject to any disclaimer, the term of this patent is extended or adjusted under 35 U.S.C. 154(b) by 25 days.

(21) Appl. No.: 16/768,766

(22) PCT Filed: Nov. 29, 2018

(86) PCT No.: PCT/EP2018/082984
§ 371 (c)(1),
(2) Date: Jun. 1, 2020

(87) PCT Pub. No.: WO2019/120921
PCT Pub. Date: Jun. 27, 2019

(65) Prior Publication Data
US 2021/0173312 A1 Jun. 10, 2021

Related U.S. Application Data

(60) Provisional application No. 62/607,962, filed on Dec. 20, 2017.

(51) Int. Cl.
*G03F 7/20* (2006.01)
*H01L 21/687* (2006.01)

(52) U.S. Cl.
CPC ...... *G03F 7/70716* (2013.01); *H01L 21/6875* (2013.01); *H01L 21/68757* (2013.01)

(58) Field of Classification Search
CPC .. G03F 7/707; G03F 7/70716; G03F 7/70875; H01L 21/683; H01L 21/6875; H01L 21/68757
USPC ............... 269/289 R; 279/3, 128; 310/12.06; 355/72, 77
See application file for complete search history.

(56) References Cited

U.S. PATENT DOCUMENTS 6,307,620 B1 * 10/2001 Takabayashi ....... G03F 7/70916
355/72
6,839,217 B1    1/2005 Larsen
2005/0024620 A1 2/2005 Van Empel et al.
(Continued)

FOREIGN PATENT DOCUMENTS

DE   102011115498   12/2012
JP   2002-131487    5/2002
(Continued)

OTHER PUBLICATIONS

International Search Report and Written Opinion issued in corresponding PCT Patent Application No. PCT/EP2018/082984, dated Mar. 29, 2019.
(Continued)

*Primary Examiner* — Deoram Persaud
(74) *Attorney, Agent, or Firm* — Pillsbury Winthrop Shaw Pittman LLP

(57) ABSTRACT

Methods and systems are described for reducing adhesion and controlling friction between a wafer and a wafer table during semiconductor photolithography wherein the tops of burls on the wafer table have a layer with a nanoscale topography.

20 Claims, 4 Drawing Sheets

(56) References Cited

U.S. PATENT DOCUMENTS

| | | | |
|---|---|---|---|
| 2007/0217114 A1 | 9/2007 | Sasaki et al. | |
| 2008/0138504 A1* | 6/2008 | Williams | C23C 14/048 |
| | | | 427/96.2 |
| 2008/0158538 A1 | 7/2008 | Puyt et al. | |
| 2010/0296073 A1 | 11/2010 | Puyt et al. | |
| 2013/0301028 A1* | 11/2013 | Albert | C23C 16/44 |
| | | | 216/37 |
| 2014/0368804 A1 | 12/2014 | Lafarre et al. | |
| 2016/0354864 A1 | 12/2016 | Hammer et al. | |
| 2021/0405539 A1* | 12/2021 | Akbas | G03F 7/70491 |
| 2022/0082945 A1* | 3/2022 | Nikipelov | H01L 21/68757 |

FOREIGN PATENT DOCUMENTS

| | | |
|---|---|---|
| JP | 2005-019993 | 1/2005 |
| JP | 2006-510229 | 3/2006 |
| JP | 2009054723 | 3/2009 |
| JP | 2010-515258 | 5/2010 |
| JP | 2014-236047 | 12/2014 |
| JP | 2017537480 | 12/2017 |
| WO | 2004097894 | 11/2004 |
| WO | 2017001135 | 1/2017 |
| WO | 2017/110660 | 6/2017 |
| WO | 2017139163 | 8/2017 |

OTHER PUBLICATIONS

Research Disclosure 602025, "Method for Improving Reticle Support", May 8, 2014.

Research Disclosure 636035, "Method for Improving Reticle or Wafer Support", Mar. 9, 2017.

Japanese Office Action issued in corresponding Japanese Patent Application No. 2020-534564, dated Jul. 13, 2021.

Japanese Office Action issued in corresponding Japanese Patent Application No. 2020-534564, dated Mar. 22, 2022.

Chinese Office Action issued in corresponding Chinese Patent Application No. 201880082603.7, dated Jul. 12, 2022.

\* cited by examiner

LITHOGRAPHY SUPPORTS WITH DEFINED BURLTOP TOPOGRAPHY

CROSS-REFERENCE TO RELATED APPLICATIONS

This application is the U.S. national phase entry of PCT Patent Application No. PCT/EP2018/082984, which was filed on Nov. 29, 2018, which claims the benefit of priority of U.S. Provisional Patent Application No. 62/607,962, which was filed on Dec. 20, 2017, and which is incorporated herein in its entirety by reference.

FIELD

The present disclosure relates to devices used to hold a wafer, reticle, mask, or the like in a photolithographic apparatus.

BACKGROUND

A lithographic apparatus applies a desired pattern onto a substrate such as a wafer of semiconductor material. A patterning device, such as a mask or a reticle, may be used to generate a circuit pattern to be formed on an individual layer of the wafer. Transfer of the pattern is typically accomplished by imaging onto a layer of radiation-sensitive material (resist) provided on the substrate. In general, a single substrate will contain adjacent target portions that are successively patterned.

The lithographic apparatus includes a support structure (e.g., wafer table) configured to hold the wafer using, for example, mechanical, vacuum, electrostatic or other clamping techniques. The support structure includes burls configured to support corresponding portions of the wafer. The surface of each of the burls that faces the wafer includes a formation of patterned bumps having dimensions on the order of nanometers. These bumps are referred to as nanobumps herein. The nanobumps define a reduced contacting surface area between the wafer and the burls. The reduced contacting surface area mitigates the sticking effect between the wafer and the burls and modifies friction during the clamping process.

The wafer table and its integral burls are typically made from a Si:SiC composite ceramic material. The wafer table surface may include on the order of 10,000 burls, each having a diameter on the order of hundreds of microns and a height the order of 100 microns. The burls typically cover on the order of 1% of the surface area of the wafer table.

The burl-top topography presents a random surface that further reduces the contact area between the wafer and the wafer table. It is desirable to have a burl top with predictable, engineered, and deterministic (nonrandom) interaction area between the burl and the wafer. An interaction area with these characteristics promotes better initial overlay performance and better (and longer) lifetime performance of wafer tables. As mentioned, however, the body of the burl is made from Si:SiC ceramic. This material is a good choice because of its strength and stability. However, it is essentially relatively hard SiC grains in a matrix of relatively softer silicon. This makes it a material that is intrinsically difficult to make smooth.

There is therefore a need for a burl-top topography with a more controllable interaction between the burl and the wafer.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect there is disclosed a burl top made by printing nanostructures ("waves," or "bumps," or other nanoscale structures) on top of a burl top that has been smoothed in part by adding a layer of a material, thereby controlling the contact area between a wafer and the burl. To address the intrinsic difficulty in smoothening the material making up the burl, the top of the burl is provided with a layer of a material such as silicon carbide onto which the nanoscale structures are imprinted. This permits the formation of nanoscale structures on a much smoother surface which facilitates subsequent production steps.

According to another aspect there is disclosed a wafer table comprising a wafer table body, a plurality of burls formed on the wafer table body, each of the burls comprising a burl body, and a layer formed on top of the burl body, a top of the layer having a plurality of nanoscale structures. The wafer table and the plurality of burls may be integral and formed together. The wafer table and the plurality of burls may both comprise Si:SiC. The layer may comprise a ceramic material which may be SiC. The layer may comprise a metallic material which may comprise aluminum. The layer may comprise an organic polymer. The nanoscale structures may be in the form of an array of dome-shaped protrusions and the array may be ordered.

According to another aspect there is disclosed a wafer table comprising a plurality of burls, each of the burls comprising a burl body and a layer comprising a ceramic material formed on top of the burl body, a top of the layer having a nanoscale topography. The wafer table and the plurality of burls may comprise a sintered material which may comprise Si:SiC. The ceramic material may be a non-oxide ceramic which may comprise SiC. The layer may be formed on the burl body using a chemical vapor deposition technique. The nanoscale topography may comprise an array of dome-shaped protrusions.

According to another aspect there is disclosed a method comprising the steps of providing a wafer table comprising a plurality of burls and forming a layer on top of the burls. The wafer table may comprise Si:SiC. The layer may comprise a ceramic material which may comprise SiC. The layer may comprise a metallic material which may comprise aluminum. The layer may comprise an organic polymer. The step of forming a layer may comprise depositing the layer using chemical vapor deposition. The method may further comprise steps following the forming a layer step of polishing the layer formed on top of the burls to create a polished burl top, forming a sacrificial layer on the polished burl top, the sacrificial layer having a plurality of nanoscale structures, and etching the sacrificial layer to transfer the pattern to the polished burl top. The sacrificial layer may comprise $Al_2O_3$. The step of etching the sacrificial layer may comprise ion beam figuring.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
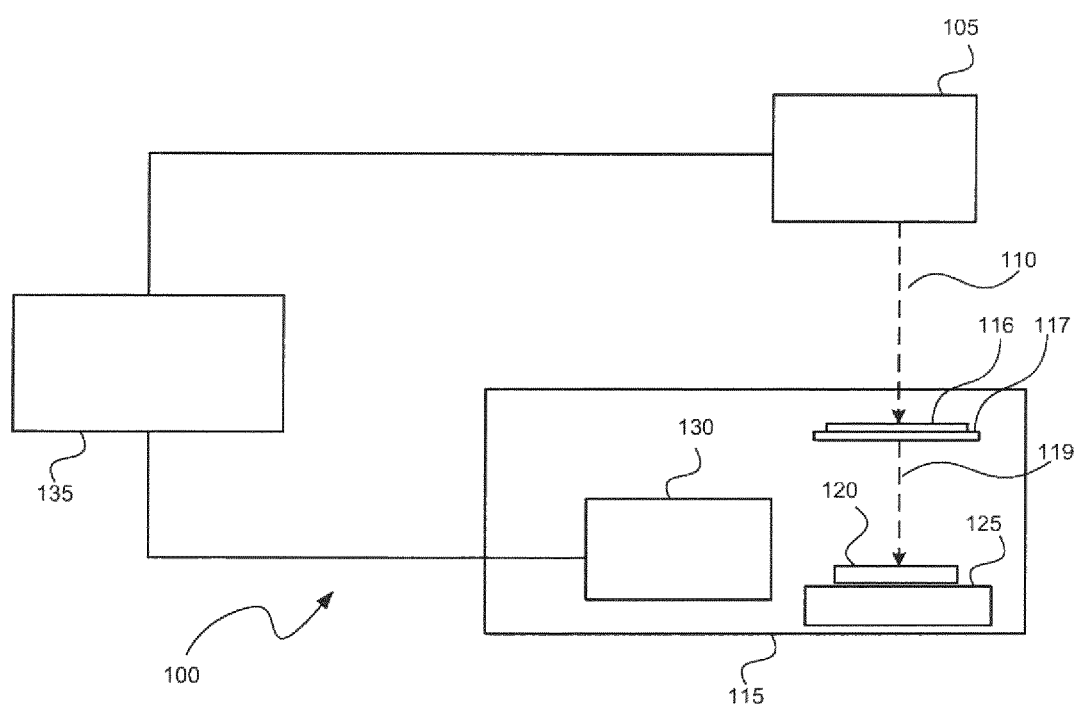
FIG. 1 shows a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

In the description that follows and in the claims the terms "up," "down," "top," "bottom," "vertical," "horizontal," and like terms may be employed. These terms are intended to show relative orientation only and not any orientation with respect to gravity. Similarly, terms such as left, right, front, back, etc., are intended to give only relative orientation.

Before describing embodiments in more detail, it is instructive to present an example environment in which embodiments of the present invention may be implemented.

Referring to FIG. 1, a photolithography system 100 that includes an illumination system 105. The illumination system 105 includes a light source that produces a pulsed light beam 110 and directs it to a photolithography exposure apparatus or scanner 115. The scanner 115 includes a patterning device 116, for example, a mask or reticle, on a support structure 117. The patterning device 116 carries a pattern that is transferred to the beam 110 to create patterned beam 119 that patterns microelectronic features on a wafer 120. The wafer 120 is placed on a wafer table 125 constructed to hold wafer 120 and connected to a positioner configured to accurately position the wafer 120 in accordance with certain parameters.

The photolithography system 100 uses a light beam 110 having a wavelength in the deep ultraviolet (DUV) range, for example, with wavelengths of 248 nanometers (nm) or 193 nm. The size of the microelectronic features patterned on the wafer 120 depends on the wavelength of the light beam 110, with a lower wavelength resulting in a smaller minimum feature size. When the wavelength of the light beam 110 is 248 nm or 193 nm, the minimum size of the microelectronic features can be, for example, 50 nm or less. The bandwidth of the light beam 110 can be the actual, instantaneous bandwidth of its optical spectrum (or emission spectrum), which contains information on how the optical energy of the light beam 110 is distributed over different wavelengths. The scanner 115 includes an optical arrangement having, for example, one or more condenser lenses, and an objective arrangement. The patterning device 116 is movable along one or more directions, such as along an optical axis of the light beam 110 or in a plane that is perpendicular to the optical axis. The objective arrangement includes a projection lens and enables the image transfer to occur from the patterning device 116 to the photoresist on the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the reticle used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The support structure 117 holds the patterning device 116 in a manner that depends on the orientation of the patterning device, the design of the lithographic apparatus, and other conditions, such as for example whether or not the patterning device is held in a vacuum environment. The support structure 117 can use mechanical, vacuum, electrostatic or other clamping techniques to hold the patterning device. The support structure 117 may be a frame or a table, for example, which may be fixed or movable as required. The support structure 117 may ensure that the patterning device 116 is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. As here depicted, the patterning device 116 is of a transmissive type (e.g., employing a transmissive mask). Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

Figure 2:
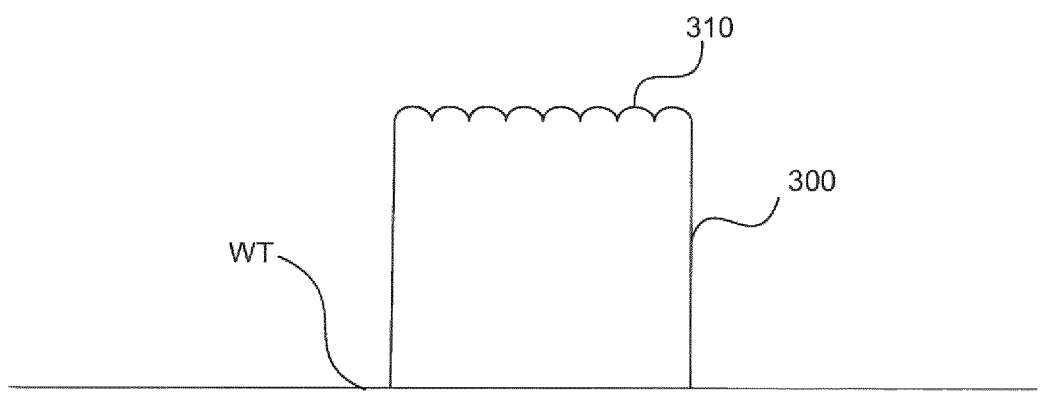
FIG. 2 is a not-to-scale diagram of a burl having a top with a nanoscale topography.

As mentioned, the wafer table may be supplied with an ordered or disordered (random) array of burls, and the top surface (that is, the surface intended to come into contact with the wafer) of each of the burls may be supplied with a topography of nanoscale structures, that is, structures having a feature size on the order on a nanometer or tens of nanometers. This is shown in FIG. 2. FIG. 2 shows a top surface of a wafer table WT having a burl 300. The top surface of the burl 300 has a nanoscale topography 310. The nanoscale topography is shown as an array of hemispherical bumps but it will be understood that other shapes such as pillars may be used. These are all referred to as nanobumps herein.

Figure 3A:
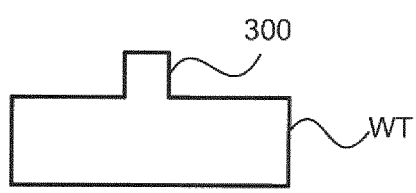
FIGS. 3A-3F are not-to-scale diagrams of a process for making a burl having a top with a nanoscale topography according to an aspect of an embodiment.

A method of making a burl having a top with a nanoscale topography will now be described with reference to FIGS. 3A-3G. FIG. 3A shows a segment of a wafer table WT with a burl 300. The relative size of the burl 300 with respect to the wafer table WT is exaggerated in FIGS. 3A-3C for clarity. The wafer table WT and the burl 300 may be made, for example, from Si:SiC.

Figure 3B:
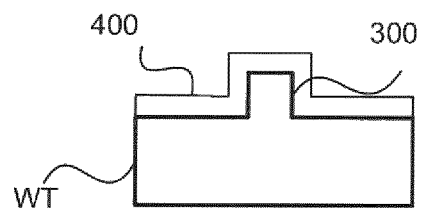

In FIG. 3B the burl 300 and the top side of wafer table WT are coated with a layer 400. The layer 400 may be made of a ceramic material such as, for example, SiC although other materials may be used, such as, for example, a metal, a metalloid such as silicon, or an organic polymer. The thickness of the layer 400 is, for example, in the range of about 0.5 microns to about 20 microns. Again, the thickness of the layer 400 is exaggerated in FIG. 3B. The layer 400 may be deposited, for example, using conventional chemical vapor deposition techniques. As noted, the material used to make the body of the burl 300 is relatively difficult to make smooth. The layer 400 provides a nonporous, smooth surface on which to perform subsequent steps. The layer 400 may be stress relieved, for example by laser ablation between the burls 300, or by covering the wafer table WT with a mask (made from, e.g., Kapton) but leaving the burls 300 exposed.

Figure 3C:
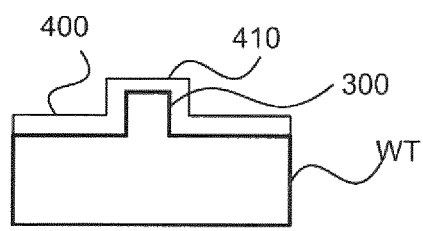

In FIG. 3C, the top portion 410 of the layer 400 is polished, e.g., to a mirror finish, to remove some of the top portion 410. Polishing may be carried out to achieve a roughness arithmetic mean Ra on the order of nanometers and so that the thickness of the top portion 410 is in the range of about 0.1 microns to about two microns. Alternatively, laser ablation can be used to lower the burl height to a desired specification by removing part of the top portion 410.

Figure 3D:
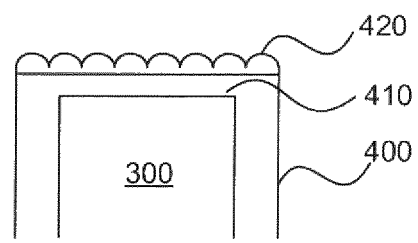

In FIG. 3D a patterned layer 420 is added to the top portion 410. This patterned layer 420 is a sacrificial layer, made, for example, of an oxide material such as $Al_2O_3$, a typical deposition metal such as aluminum, or with an organic polymer such as a photoresist. The patterned layer 420 may be added by evaporation through a mask (e.g. a mesh sieve) placed a certain distance from the wafer table WT.

Figure 3E:
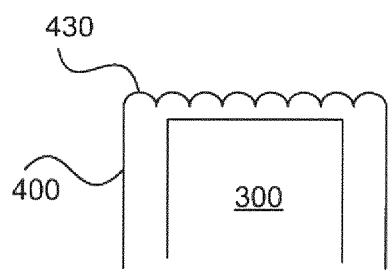
Figure 3F:
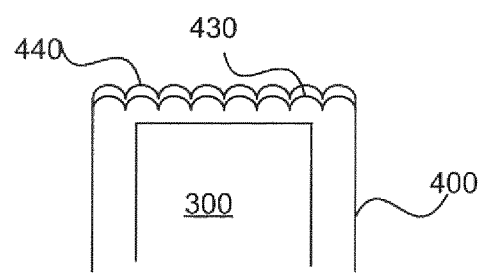

In FIG. 3E the pattern in patterned layer 420 is essentially imprinted onto the top portion 410 to create a patterned top portion 430. This can be done by etching the patterned layer 420 away using, for example, Ion Beam Figuring (IBF), or Reactive Ion Etching (RIE). In FIG. 3F the patterned top portion 430, now having a nanostructure, is coated with a low friction/low wear coating such as Diamond-like Carbon (DLC). After this the wafer table WT is assembled and flattened to desired specifications using, for example, IBF.

Figure 4:
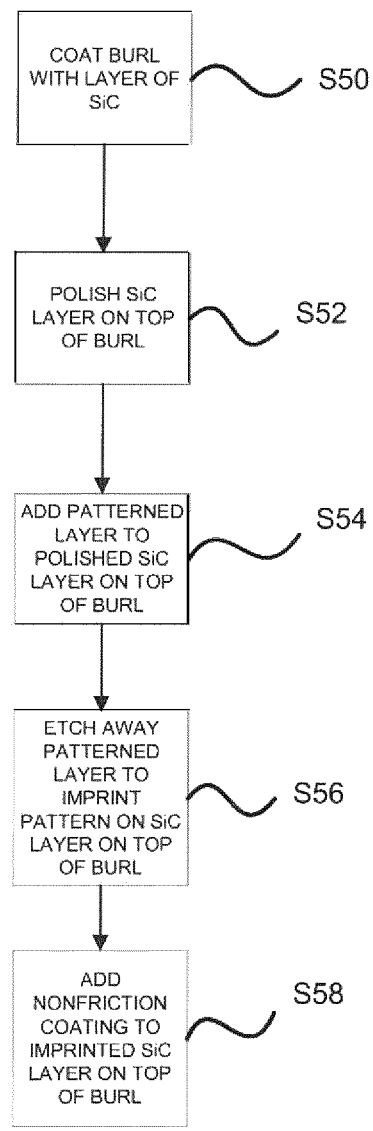
FIG. 4 is a flowchart illustrating a process for making a burl having a top with a nanoscale topography according to an aspect of an embodiment.

A method of making a burl having a top with a nanoscale topography will now be described with reference to FIG. 4. In a step S50 the burl is coated with a layer of a smoothing material such as SiC. In a step S52 the top portion of the layer is polished. In a step S54 a patterned layer is added to the top portion of the SiC layer. In a step S56 the patterned layer is etched to imprint the pattern on the top of the SiC layer. In a step S58 the patterned top portion of the SiC layer is coated with a low friction coating.

Another advantage of the disclosed arrangement is that achieving roughness and flatness at the same time can be very technically challenging. In particular, it is difficult to make a wafer table with extremely high flatness while at same time having a reasonably rough burl top. The process disclosed herein simplifies the process of manufacturing a wafer table because making a smooth burl top in the first instance and then roughening it in a defined way is easier than making a rough burl top in the first instance. Additionally, the method disclosed to fabricate the nanobumps can be used to cheaply retrofit tables returning from the field.

As mentioned, other deterministic (nonrandom) topographies, e.g. pillars of various sizes, also allow for controlled burl—wafer interaction and so can also be used. Another approach is to create a 'domed' burl, where material is removed from the edge of a nominally flat burl, thus decreasing unclamped contact area.

The embodiments may further be described using the following clauses:

1. A wafer table comprising:
   a wafer table body;
   a plurality of burls formed on the wafer table body, each of the burls comprising a burl body, and
   a layer formed on top of the burl body, a top of the layer having a plurality of nanoscale structures.

2. A wafer table of clause 1 wherein the wafer table and the plurality of burls are integral and formed together.

3. A wafer table of clause 1 wherein the wafer table and the plurality of burls both comprise Si:SiC.

4. A wafer table of clause 1 wherein the layer comprises a ceramic material.

5. A wafer table of clause 4 wherein the ceramic material is SiC.
6. A wafer table of clause 1 wherein the layer comprises a metallic material.
7. A wafer table of clause 6 wherein the metallic material comprises aluminum.
8. A wafer table of clause 1 wherein the layer comprises an organic polymer.
9. A wafer table of clause 1 wherein the nanoscale structures are in the form of an array of dome-shaped protrusions.
10. A wafer table of clause 1 wherein the array is ordered.
11. A wafer table comprising a plurality of burls, each of the burls comprising a burl body and a layer comprising a ceramic material formed on top of the burl body, a top of the layer having a nanoscale topography.
12. A wafer table of clause 11 wherein the wafer table and the plurality of burls comprise a sintered material.
13. A wafer table of clause 12 wherein the sintered material comprises Si:SiC.
14. A wafer table of clause 11 wherein the ceramic material is a non-oxide ceramic.
15. A wafer table of clause 14 wherein the non-oxide ceramic comprises SiC.
16. A wafer table of clause 11 wherein the layer is formed on the burl body using a chemical vapor deposition technique.
17. A wafer table of clause 11 wherein the nanoscale topography comprises an array of dome-shaped protrusions.
18. A method comprising the steps of:
providing a wafer table comprising a plurality of burls; and
forming a layer on top of the burls.
19. A method of clause 18 wherein the wafer table comprises Si:SiC.
20. A method of clause 18 wherein the layer comprises a ceramic material.
21. A method of clause 20 wherein the ceramic material comprises SiC.
22. A method of clause 18 wherein the layer comprises a metallic material.
23. A method of clause 22 wherein the metallic material comprises aluminum.
24. A wafer table of clause 18 wherein the layer comprises an organic polymer.
25. A method of clause 18 wherein the step of forming a layer comprises depositing the layer using chemical vapor deposition.
26. A method of clause 18 further comprising steps following the forming a layer step of polishing the layer formed on top of the burls to create a polished burl top;
forming a sacrificial layer on the polished burl top, the sacrificial layer having a plurality of nanoscale structures; and
etching the sacrificial layer to transfer the pattern to the polished burl top.
27. A method of clause 18 wherein the sacrificial layer comprises $Al_2O_3$.
28. A method of clause 18 wherein the step of etching the sacrificial layer comprises ion beam figuring.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the present invention have been described above, it will be appreciated that the present invention may be practiced other than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:
1. A wafer table comprising:
a wafer table body;
a plurality of burls on the wafer table body, the burls configured to support a wafer on the wafer table and each of the burls comprising a burl body,
a layer on top of the burl body, a top of the layer having a plurality of nanoscale structures formed by the layer; and
a further layer overlying the nanoscale structures.

2. The wafer table as claimed in claim 1, wherein the wafer table and the plurality of burls are integral and formed together.

3. The wafer table as claimed in claim 1, wherein the wafer table and the plurality of burls both comprise Si:SiC.

4. The wafer table as claimed in claim 1, wherein the layer comprises a ceramic material.

5. The wafer table as claimed in claim 4, wherein the ceramic material is SiC.

6. The wafer table as claimed in claim 1, wherein the layer comprises a metallic material.

7. The wafer table as claimed in claim 6, wherein the metallic material comprises aluminum.

8. The wafer table as claimed in claim 1, wherein the layer comprises an organic polymer.

9. The wafer table as claimed in claim 1, wherein the nanoscale structures are in the form of an array of dome-shaped protrusions.

10. The wafer table as claimed in claim 9, wherein the array is ordered.

11. A wafer table comprising:
a plurality of burls configured to support a wafer on the wafer table, each of the burls comprising a burl body;
a layer comprising a ceramic material on top of the burl body, a top of the layer having an ordered nanoscale topography formed by the layer; and
a further layer overlying the nanoscale topography.

12. The wafer table as claimed in claim 11, wherein the wafer table and the plurality of burls comprise a sintered material.

13. The wafer table as claimed in claim 12, wherein the sintered material comprises Si:SiC.

14. The wafer table as claimed in claim 11, wherein the ceramic material is a non-oxide ceramic.

15. The wafer table as claimed in claim 14, wherein the non-oxide ceramic comprises SiC.

16. The wafer table as claimed in claim 11, wherein the nanoscale topography comprises an array of dome-shaped protrusions.

17. A method comprising:
providing a wafer table comprising a plurality of burls; and
forming and etching a layer on top of the burls such that a top of the layer has a plurality of nanoscale structures etched into the layer.

18. The method as claimed in claim 17, wherein the wafer table comprises Si:SiC.

19. The method as claimed in claim 17, wherein the layer comprises a ceramic material.

20. The method as claimed in claim 17, wherein the layer comprises a metallic material.

* * * * *